(12) United States Patent
Li et al.

(10) Patent No.: US 6,597,062 B1
(45) Date of Patent: Jul. 22, 2003

(54) SHORT CHANNEL, MEMORY MODULE WITH STACKED PRINTED CIRCUIT BOARDS

(75) Inventors: Che-yu Li, Ithaca, NY (US); Sharon L. Moriarty, Mountain View, CA (US)

(73) Assignee: High Connection Density, Inc., Sunnyvale, CA (US)

( * ) Notice: Subject to any disclaimer, the term of this patent is extended or adjusted under 35 U.S.C. 154(b) by 0 days.

(21) Appl. No.: 10/212,016

(22) Filed: Aug. 5, 2002

(51) Int. Cl.$^7$ ................................................ H01L 23/02
(52) U.S. Cl. ........................................ 257/686; 257/777
(58) Field of Search .................................. 257/686, 777

(56) References Cited

U.S. PATENT DOCUMENTS 6,005,776 A * 12/1999 Holman et al. ............. 361/760
6,404,662 B1 * 6/2002 Cady et al. ................... 365/63

OTHER PUBLICATIONS

U.S. patent application Ser. No. 09/932,525, Li et al., filed Aug. 17, 2001.
U.S. patent application Ser. No. 09/932,654, Li et al., filed Aug. 17, 2001.
U.S. patent application Ser. No. 10/077,057, Moriarty et al., filed Feb. 19, 2002.

* cited by examiner

Primary Examiner—Hoai Ho
Assistant Examiner—Tu-Tu Ho
(74) Attorney, Agent, or Firm—Salzman & Levy

(57) ABSTRACT

The present invention is a family of memory modules. In one embodiment a memory module with granularity, upgradeability, and high throughput of at least 4.2 gigabytes per second using two channels of RAMBUS memory devices in a typical volume of just 2.2 inches by 1.1 inches by 0.39 inch. Each module includes an impedance-controlled substrate having contact pads, memory devices and other components, including optional driver line terminators, on its surfaces. The inclusion of spaced, multiple area array interconnections allows a row of memory devices to be serially mounted between each of the area array interconnections, thereby minimizing the interconnect lengths and facilitating matching of interconnect lengths. Short area array interconnections, including BGA, PGA, and LGA options or interchangeable alternative connectors provide interconnections between the modules and the rest of the system. Thermal control structures may be included to maintain the memory devices within a reliable range of operating temperatures.

41 Claims, 11 Drawing Sheets

SHORT CHANNEL, MEMORY MODULE WITH STACKED PRINTED CIRCUIT BOARDS

RELATED PATENT APPLICATIONS

This application is related to copending U.S. patent applications Ser. Nos. 09/932,525, filed Aug. 17, 2001, 09/932,654, filed Aug. 17, 2001, and 10/077,057, filed Feb. 19, 2002, all of which are hereby incorporated by reference.

FIELD OF THE INVENTION

The present invention relates to high input/output (I/O), high density, low cost electronic modules and, more particularly, to high I/O, high density, low cost packaging of high performance, high density memory devices such as RAMBUS® devices using impedance-controlled buses for maintaining high electrical performance.

BACKGROUND OF THE INVENTION

In data processing and network systems, it is always a certainty that the demand in memory throughput will increase at a high rate. In recent years such increase has taken on a new dimension. While the demand for memory throughput has increased, the space available for mounted memory devices has become increasingly restricted.

RAMBUS architecture-based memory devices are the fastest commercially available memory devices, operating at frequencies up to 533 megahertz. A 16-bit RAMBUS data bus has an effective maximum throughput of 2.1 gigabytes per second (GB/s). In comparison, the maximum throughput available from a 64-bit Double Data Rate (DDR) Synchronous Dynamic Random Access Memory (SDRAM) data bus using the fastest DDR memory devices available is only 2.7 GB/s. Therefore, the effective throughput of a 64-bit RAMBUS data bus, implemented by using four RAMBUS-ASIC Cells (RACs) is 8.4 GB/s, or more than three times the throughput of an equivalent DDR SDRAM based system.

The RAMBUS architecture achieves this performance by serially connecting memory devices on a bus rather than using the more common parallel connecting, as found in SDRAM based memory subsystems. To ensure fast memory cycle times, extremely short, fast rise pulses are used. The RAMBUS architecture also makes use of separate differential clock pairs for data in both the transmit and receive directions to improve the bus efficiency and operational speeds. Parceling clocks and data together and minimizing skew between data/clocks and control information within a given packet make it possible to have multiple data packets co-existing on the channel boosting the overall performance and operational speed of the architecture.

A RAMBUS channel supports from one to 32 memory devices, making for a very granular architecture. The memory devices can either be mounted on a system board or located on modules that are then inserted into the system board. Currently, RAMBUS technology features a memory configuration wherein memory devices are disposed (packaged) on up to three RAMBUS Inline Memory Modules (RIMMs) or small outline RIMMs (SO-RIMMs) all interconnected on a system board by a high speed data bus. One or more termination components are placed on the system board at the physical end of the bus.

It is critical that the RAMBUS channel is uniform and capable of achieving the low intra-packet skew variations and voltage margins requirements within the operational speeds to be supported. RIMM and SO-RIMM memory modules and mating sockets have difficulty in achieving this, especially as operating frequencies continue to increase.

Memory subsystems based on the RAMBUS architecture offer space-saving advantages over alternative memory architectures such as DDR SDRAM for an equivalent level of data throughput. For example, there are many high data rate, space-constrained applications where there is only enough space available for a single memory device on a channel. In such application, a single RAMBUS device placed adjacent to the host chip typically offers three times the throughput of a single device DDR SDRAM channel and six times the throughput of a single device SDRAM memory subsystem.

Many SDRAM and DDR SDRAM memory subsystems will be further space-constrained to provide for a certain minimum defined bus width within their respective architectures. This often means that the memory subsystem will contain a minimum of four or eight memory devices since the alternative of using 32-bit or 64-bit memory devices is usually not an acceptable option due to cost or availability. Also, the memory devices in the RAMBUS architecture are serially connected to the bus, making it possible to locate the memory devices closer to the host chip and therefore saving space. In a DDR SDRAM-based memory subsystem, this is not possible due to the requirement of length matching on the data bus.

The inclusion of bus terminations on the memory modules themselves also provides several types of performance improvement. First, because only a single set of contacts need be used (i.e., there is no need to have the bus lines exit the module), the additional contact capacity may be devoted to addressing an additional channel of memory on the same module. This also significantly reduces the total bus path length since the portion of the bus path between the memory modules and the external terminator resistors of the prior art is eliminated. In a stacked memory subsystem, the terminations may be provided on a separate termination module with little degradation in performance or increase in required space.

Traditionally, a piece of rack-mountable equipment has a standard width of 19 inches and a height in increments of 1.75 inches. This is also known as "1U." However, a trend has begun to reduce the height for the servers in a server rack to dimensions appreciably lower than 1U. This equipment height restriction has also placed height restrictions on other components such as memory modules. Traditional RIMMs are simply too tall to be able to be mounted vertically on the system board.

There are applications where each processor requires two or more short channels of memory. If standard RIMMs or SO-RIMMs are used, a significant amount of printed circuit board space is wasted and additional printed circuit trace length is required. Furthermore, RIMMs and SO-RIMMs do not have the quantity of I/O or connections necessary to support more than two channels of memory, even if the modules are self-terminated. A solution is needed to meet the requirements for higher I/O, reduced printed circuit board real estate, and shorter printed circuit trace lengths.

It is desirable to find a packaging solution resolving both the throughput and the density issues. In addition, the solution must also be low in cost, readily manufacturable, upgradeable with ample granularity, have improved electrical performance even at high frequencies, and have good reliability. Ample granularity allows the amount of memory on a given memory module to be increased or decreased in smaller increments (e.g., in increments of 64 megabytes, instead of 128 megabytes).

It is therefore an object of the invention to provide a high throughput, high density, low profile RAMBUS memory module for high performance memory devices.

It is another object of the invention to provide a high throughput, high density, low profile RAMBUS memory module that is readily manufacturable and upgradable.

It is still another object of the invention to provide a high throughput, high density, low profile RAMBUS memory module providing improved electrical performance at high frequencies and good reliability.

SUMMARY OF THE INVENTION

The present invention is a family of specialized embodiments of the modules taught in the referenced copending U.S. patent applications. A memory module is desired with granularity, upgradeability, and high throughput of at least 4.2 gigabytes per second using two channels of RAMBUS memory devices in a typical volume of just 2.2 inches by 1.1 inches by 0.39 inch.

Each module includes a substrate having contact pads and memory devices on its surfaces, and impedance-controlled transmission line signal paths to support high speed operation. The substrates may be conventional printed circuit cards, preferably with packaged memory devices along with other components attached directly to both sides of the substrates.

The inclusion of spaced, multiple area array interconnections allows a row of memory devices to be serially mounted between each of the area array interconnections, thereby minimizing the interconnect lengths and facilitating matching of interconnect lengths. The footprints for the interconnections between the substrates and to the system board are the same to reduce part numbers and reliability and qualification testing. Short area array interconnections, including ball grid array (BGA), pin grid array (PGA), and land grid array (LGA) options, or interchangeable alternative connectors, provide interconnections between modules and the rest of the system. Preferably, the distance between the spaced multiple area array interconnections is chosen to ensure the solder joints in the BGA interconnection option are reliable.

Driver line terminators, voltage regulators, and direct RAMBUS clock generator (DRCG) circuits and all associated components may be included on the substrates for maintaining high electrical performance. Thermal control structures may also be included to maintain the memory devices within a reliable range of operating temperatures.

BRIEF DESCRIPTION OF THE DRAWINGS

A complete understanding of the present invention may be obtained by reference to the accompanying drawings, when considered in conjunction with the subsequent detailed description, in which:

FIG. 1b is an enlarged, side elevational view of a vertical plated-through-hole attach connector and memory card of the prior art memory arrangement shown in FIG. 1a;

FIG. 1c is an enlarged, side elevational view of a low profile connector and memory card of the prior art memory arrangement shown in FIG. 1a;

FIG. 2b is a cross-sectional view of a portion of a memory subsystem based on the memory module of FIG. 2a;

FIG. 3b is a cross-sectional view of a first channel of the multi-card configuration shown in FIG. 3a;

FIG. 3c is a cross-sectional view of a second channel of the multi-card configuration shown in FIG. 3a;

FIG. 3d is a cross-sectional view of a first channel of an alternate embodiment based on the multi-card configuration shown in FIG. 3a;

FIG. 3e is a cross-sectional view of a second channel of an alternate embodiment based on the multi-card configuration shown in FIG. 3a;

FIG. 3f is a cross-sectional view of a memory module including additional functionality in accordance with an extension of the embodiment of FIG. 3a; and FIG. 4 is a top view of a memory module in accordance with an extension of the embodiment of FIG. 2a.

DETAILED DESCRIPTION OF THE PREFERRED EMBODIMENT

Generally speaking, the present invention is a family of specialized embodiments of the modules taught in the referenced copending U.S. patent applications. A memory module is desired with granularity, upgradeability, and high throughput of at least 4.2 gigabytes per second using two channels of RAMBUS memory devices in a typical volume of just 2.2 inches by 1.1 inches by 0.39 inch.

Each module includes a substrate having contact pads and memory devices on its surfaces, and impedance-controlled transmission line signal paths to support high speed operation. The substrates may be conventional printed circuit cards, preferably with packaged memory devices along with other components attached directly to both sides of the substrates.

Figure 1A:
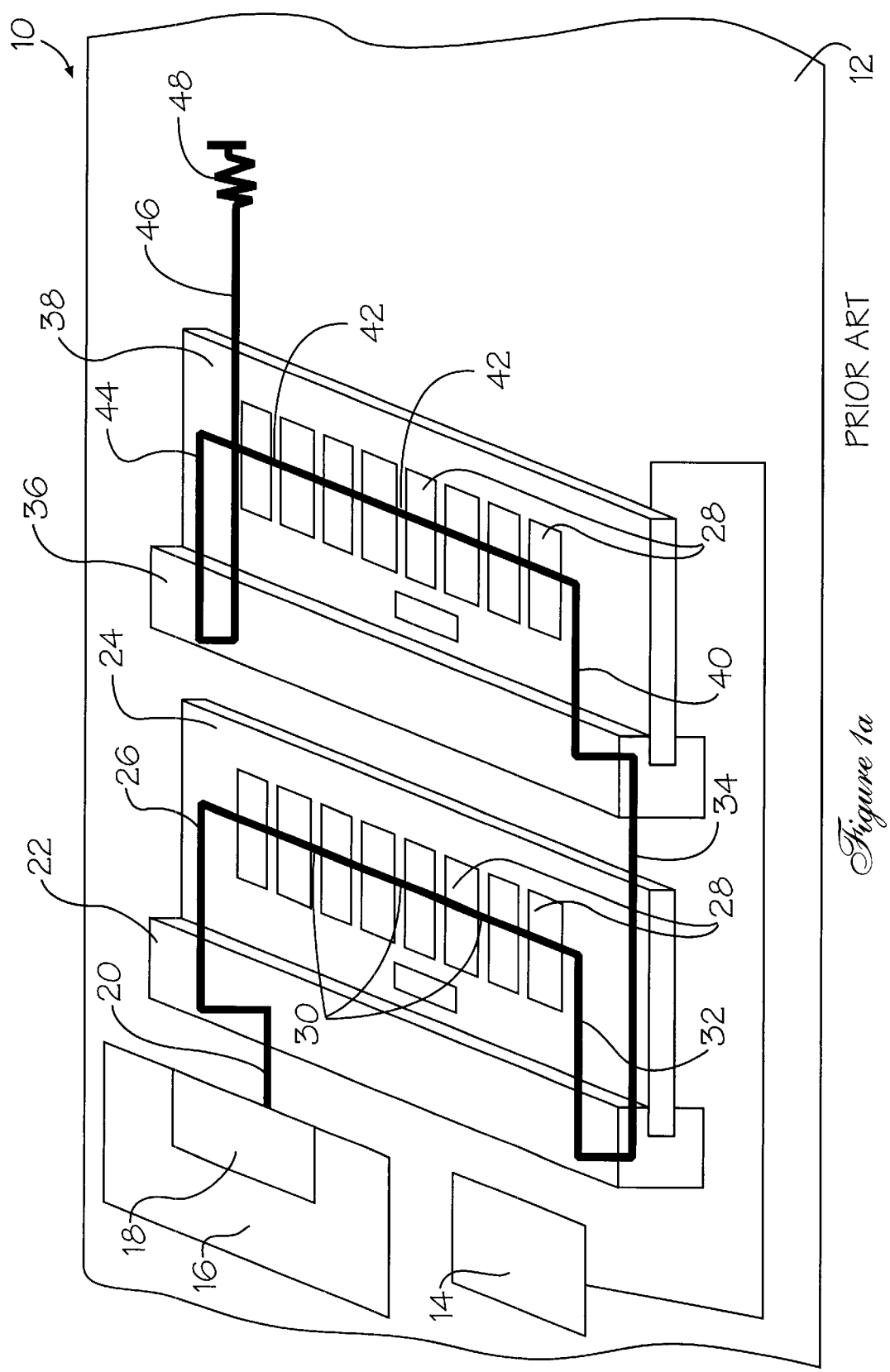
FIG. 1a is a representation of a multi-card memory arrangement of the prior art with bus termination on the motherboard.

The inclusion of spaced, multiple area array interconnections allows a row of memory devices to be serially mounted between each of the area array interconnections, thereby minimizing the interconnect lengths and facilitating matching of interconnect lengths. The footprints for the interconnections between the substrates and to the system board are the same to reduce part number and reliability and qualification testing. Short area array interconnections, including ball grid array (BGA), pin grid array (PGA), and land grid array (LGA) options, or interchangeable alternative connectors, provide interconnections between modules and the rest of the system. Preferably, the distance between the spaced multiple area array interconnections is chosen to ensure that the solder joints in the BGA interconnection option are reliable. Referring first to FIG. 1a, there is shown a representation of a multi-card (two-card) memory system 10 of the prior art. Conventional two-slot and three-slot boards require terminations on the motherboard 12, which are needed even when all slots are not used. Signal quality is extensively degraded by the electrically noisy, standard card-on-board connectors 22, 36, which provide signal paths between RIMMs 24, 38 and circuitry on the motherboard 12.

A portion of a motherboard 12 is shown with support circuitry needed for implementing the RAMBUS memory system. A Direct RAMBUS Clock Generator (DRCG) circuit 14 and a master device 16 containing a Direct RAM- BUS ASIC Cell (DRAC) 18 are implemented on motherboard 12. The RAMBUS channel segment 20 connects DRAC 18 to a first connector 22, which is physically connected to motherboard 12. RAMBUS channel segment 20 connections are generally made by internal printed wiring traces (not shown). First connector 22 generally has a plurality of spring-loaded contacts designed to engage mating contact pads on a first RIMM 24.

In the RAMBUS architecture, 184 contacts are generally provided on each memory module. RAMBUS channel segment 20 enters first RIMM 24 at a bus entry region 26 and is then connected to a number of individual memory devices 28 attached to RIMM 24 through device connection segments 30. The RAMBUS channel next exits RIMM 24 via a RAMBUS channel exit region 32, and passes from first RIMM 24 back to motherboard 12. Additional printed wiring traces carry the RAMBUS channel segment 34 to a second connector 36 also on motherboard 12. Second connector 36 holds a second RIMM 38.

A RAMBUS channel entry portion 40, a series of memory devices 28, a series of device connection segments 42, and a RAMBUS channel exit portion 44 make up second RIMM 38. RAMBUS channel segment 46 finally reaches terminations 48 at the end of the circuitous routing of the bus after passing through printed circuit traces.

Termination components 48 such as resistors, bulk capacitors, and/or decoupling capacitors are also placed on motherboard 12. All RAMBUS channel signals must pass through two connectors 22, 36 and across two RIMMs 24, 38 before reaching terminations 48. Signal degradation occurs along the path of the RAMBUS channel, especially at connectors 22 and 36. In addition, valuable "real estate" is consumed on the motherboard 12 itself.

RIMMs 24, 38 typically are printed circuit structures, comprising epoxy-glass-based materials (i.e., FR4) and include one or more conductive (i.e., signal, power and/or ground) layers therein. Due to the stringent RAMBUS electrical specifications, the signal traces must match the system impedance within ten percent.

Figure 1B:
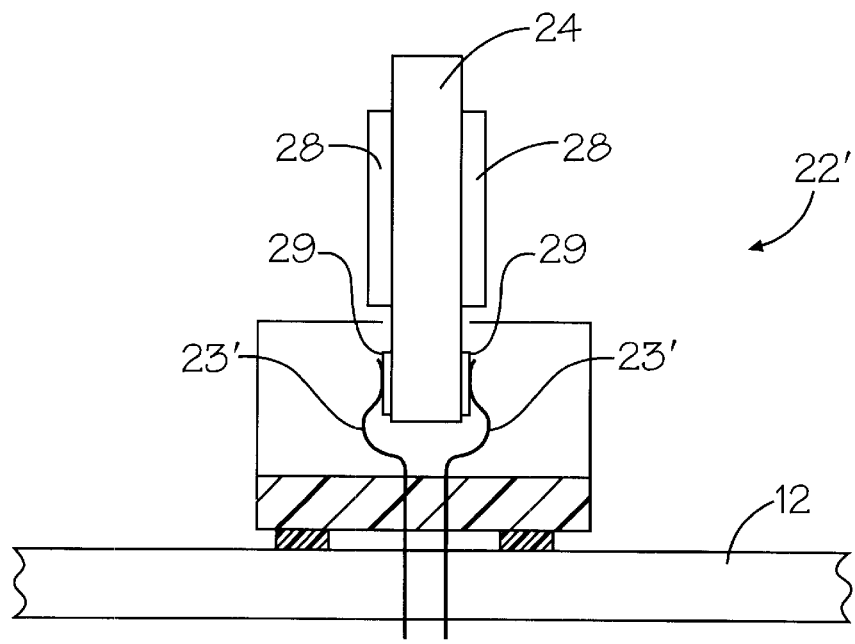
Figure 1C:
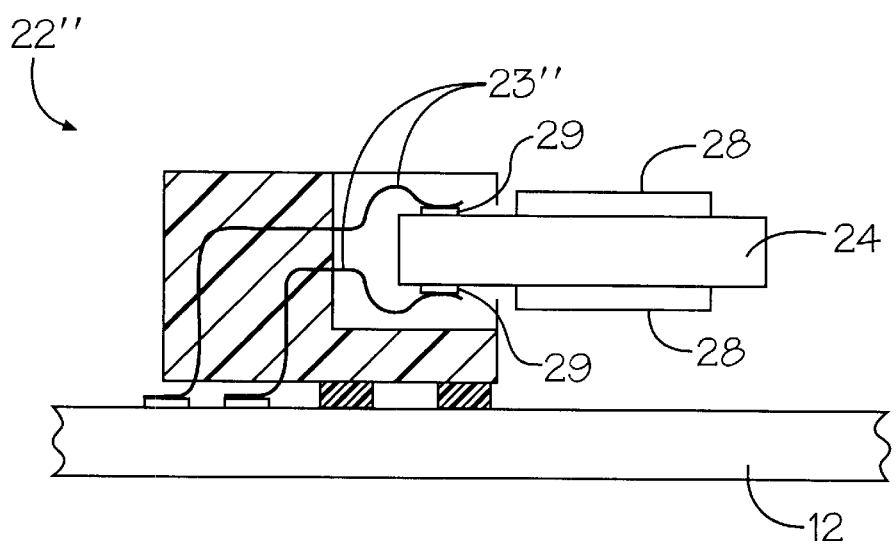

The connectors shown hereinbelow in FIGS. 1b and 1c are vertical and horizontal physical representations, respectively, of the schematic connectors 22, 36 of FIG. 1a. Since connectors 22 and 36 are typically the same, only connector 22 is described in FIGS. 1b and 1c.

Referring now to FIG. 1b, there is shown an enlarged, side elevational view of a vertical plated-through-hole attach connector and memory card of the prior art shown in FIG. 1a. Spring-loaded contacts 23' of connector 22' provide electrical connection between motherboard 12 and contact pads 29 on RIMM 24. Connectors 22' of this type are available with either plated-through-hole attach or surface-mount attach to a structure such as motherboard 12 (FIG. 1a), with the plated-through-hole attach style being electrically inferior but more commonly used. In either case, the connectors 22' result in a significant electrical discontinuity, especially at today's high bus speeds. This impedance discontinuity is manifested in increased electrical noise and time delay due to reflections. Also this vertical style of connector is unusable in low profile applications. Contacts 23' in connectors 22' have a relatively high inductance, typically greater than 2 nanohenries (nH). Contacts 23' also exhibit a relatively high amount of crosstalk due to the relatively large surface areas of the contact pads 29 for energy radiating from adjacent pads 23'. The impedance discontinuity of connector 22' is particularly harsh on RAMBUS signals, which need to be routed as a uniform 28-ohm channels. This discontinuity results in the need to introduce C-TABs at the connector 22' to compensate for the high inductance of the contacts 23'. The inclusion of C-TABs is an extra step for the designer and it requires additional real estate on system board 12. In contrast, BGA interconnections and LGA connectors have lower inductance and crosstalk, and can be implemented relatively easily to have the same impedance as the RAMBUS channel of 28 ohms, hence eliminating the electrical discontinuity and reflections at connector 22' and obviating the requirement for C-TABs as described hereinabove.

Referring now to FIG. 1c, there is shown an enlarged, side elevational view of a low profile connector and a RIMM of the prior art shown in FIG. 1a. Spring-loaded contacts 23" of connector 22" provide electrical connection between motherboard 12 and contact pads 29 on RIMM 24. Connectors 22" of this type are primarily surface-mount attached to a structure such as motherboard 12 (FIG. 1a). Again the connectors 22" create a significant electrical discontinuity, especially at today's high bus speeds. This horizontal style of connector 22" does have a much lower profile to make it usable in low profile applications, but requires much more motherboard real estate in multi-card applications. A two-level stacked version of this connector is available, but since the connections to the spring contacts are even longer, the electrical discontinuity, and therefore the electrical noise, is even worse.

While RIMM modules 24, 38 have been chosen for purposes of disclosure, modules 24, 38 may also be of the smaller SO-RIMM form factor. Also, the specific arrangement and location of memory devices 28 on modules 24, 38 may vary depending on the specific application and do not really affect the prior art or the invention disclosed hereinbelow, but the quantity of memory devices is subject to RAMBUS specifications and limitations.

Figure 2A:
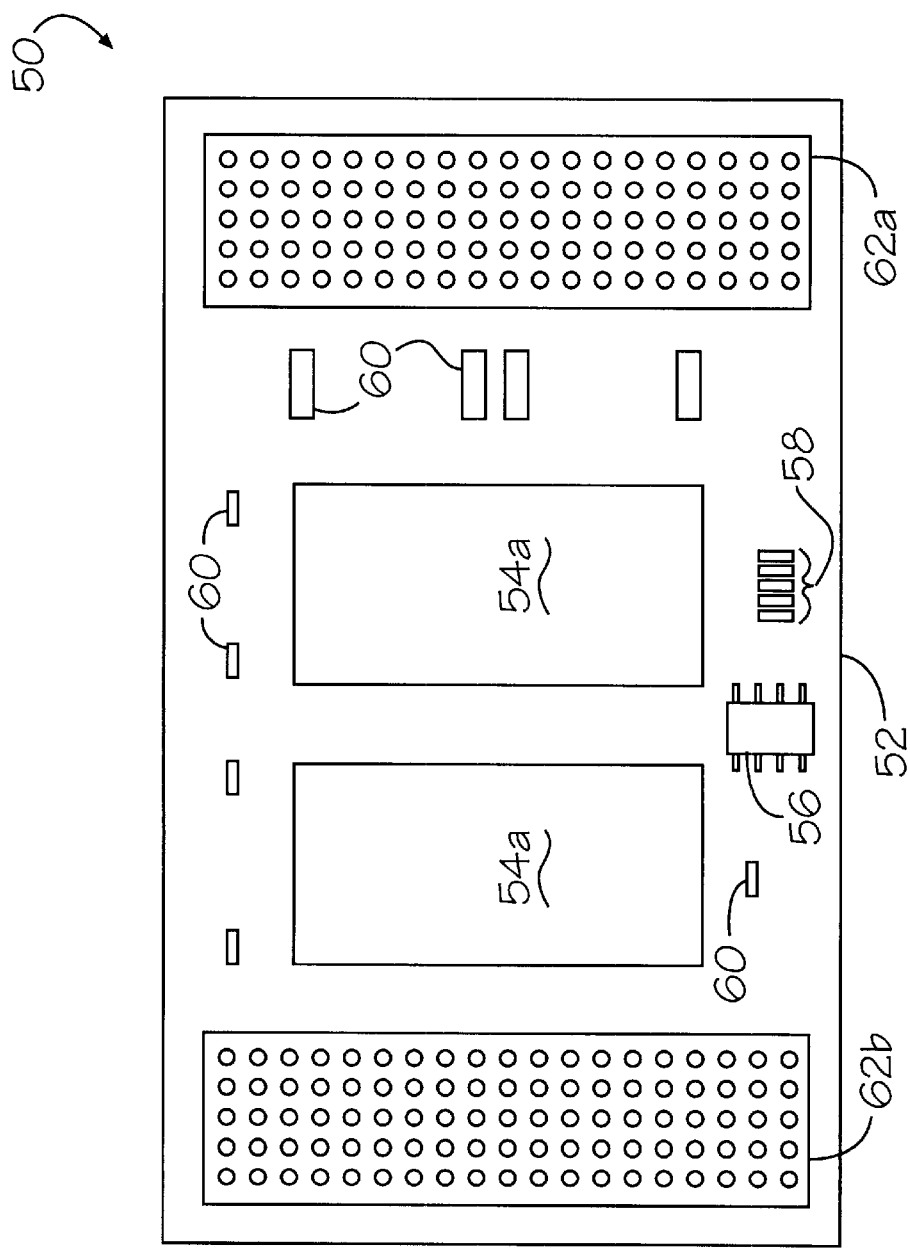
FIG. 2a is a top view of a memory module in accordance with one embodiment of the present invention.
Figure 2B:
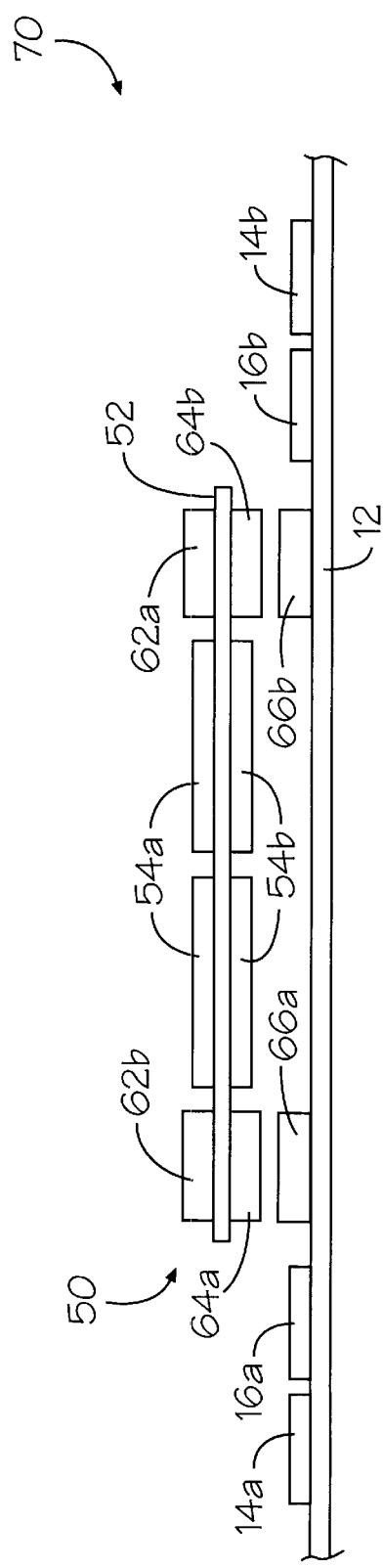

Referring now to FIGS. 2a and 2b, there are shown a top view of a memory module 50 in accordance with one embodiment of the present invention, and a cross-sectional view of a memory subsystem 70 based on the memory module 50 of FIG. 2a, respectively.

Memory module 50 includes a substrate 52, a plurality of memory devices 54a, a configuration memory device 56, resistors 58, capacitors 60, and upper interconnection arrays 62a and 62b. Lower interconnection arrays 64a and 64b and memory devices 54b are located on the opposite side (FIG. 2b) of substrate 52.

In this embodiment, memory devices 54a and 54b are 256 megabyte (MB) RAMBUS memory devices in chip scale packages (CSPs), although other packages, such as bare chip, thin, small-outline packages (TSOP), BGA, and chip on board (COB) may be used. Memory devices 54a and 54b may also have 288 MB of memory if additional bits for parity/error checking and correcting (ECC) are included. The preferred use of packaged devices 54a and 54b eliminates the issues associated with known good die (KGD). Although 256 MB devices are the largest devices available today, it should be understood that memory device capacity is certain to increase in the future, and the use of higher as well as lower capacity memory devices is well within the scope of this invention.

Examples of substrate 52 suitable for interconnection include printed circuit boards, circuit modules, etc. The term "printed circuit board" is meant to include but not be limited to a multilayered circuit structure including one or more conductive (i.e., signal, power and/or ground) layers therein. Such printed circuit boards, also known as printed wiring boards, are well known in the art and further description is not believed necessary. The term "circuit module" is meant to include a substrate or like member having various electrical components (e.g., semiconductor chips, conductive circuitry, etc.), which may form part thereof. Such modules are also well known in the art and further description is not believed necessary.

Substrate 52 may comprise a wide variety of dielectric materials. In one example it is made of epoxy-glass-based materials typically used in printed circuit-board fabrication (e.g., FR4) and also includes one or more conductive layers therein. Due to stringent electrical specifications, the signal traces typically match the system impedance within a certain tolerance (e.g., ten percent). These materials are preferred because their CTE substantially matches the CTE of the surrounding structures, especially for applications including LGA connectors, and because of their relatively low cost. Other possible materials include polyimide and RO2800 (a trademark of Rogers Corporation). It should be understood by those skilled in the art that other materials may also be used without departing from the spirit of the invention.

Configuration memory device 56 is used to store configuration information about the module 50 for use by the system. In this embodiment device 56 is an electrically erasable programmable read-only memory (EEPROM) device. Resistors 58 may be used as pull-up and pull-down resistors for the EEPROM 56. Capacitors 60 are strategically located, especially near memory devices 54a and 54b, and function as decoupling capacitors. Both resistors 58 and capacitors 60 are implemented as surface mount devices in this embodiment but may be implemented in other form factors such as embedded components.

A significant contribution to the advantages of the present invention is derived from the locations of the footprint of upper interconnection arrays 62a and 62b and mating lower interconnection arrays 64a and 64b (FIG. 2b), which may be implemented in many ways. These short area array interconnections may use BGA, PGA, or LGA options, or interchangeable alternative connectors as better shown in FIG. 2b. The specific choice of connectors for interconnection arrays 62a–62b and mating 64a–64b is design dependent and may vary depending on a specific set of requirements. Fox example, the PGA and LGA options are demountable and are therefore useful for applications requiring field upgradeability. The LGA option may require an alignment and clamping mechanism. Implementations of these items are covered in one of the referenced copending U.S. patent applications.

The separated interconnection arrays 62a and 62b on the top surface and 64a and 64b on the bottom surface allow the rows of memory devices 54a and 54b to be connected to the respective interconnection clusters by the shortest path length, which provides the shortest overall possible electrical paths from the memory devices 54a and 54b to system board 12 (FIG. 2b) and facilitates the matching of interconnect length. From a mechanical point of view, the distance between the interconnection arrays 62a–62b and 64a–64b is chosen to be wide enough to support the required quantity of memory devices 54a and 54b, but narrow enough to ensure that the solder joints in the BGA interconnection option are reliable.

Referring now again to FIG. 2b, there is shown a cross-sectional view of a portion of a memory subsystem 70 based on the memory module 50 of FIG. 2a. In one example of this embodiment, memory subsystem 70, which includes memory module 50, has a capacity of 128 megabytes of memory in a typical volume of just 2.0 inches by 1.1 inches by 0.39 inch, or about 0.86 cubic inches, and requires only 2.0 inches by 1.1 inches, or 2.2 square inches of area on system board 12. Compared to prior art embodiments, the area and volumetric requirement of the invention are significantly reduced, while allowing even higher memory expansion capability through additional stacking.

Lower interconnection arrays 64a and 64b on memory module 50 are provided to allow electrical interconnection to DRCG circuits 14a and 14b and master devices 16a and 16b, respectively, on system board 12 through mating connectors 66a and 66b. Each master device 16a and 16b may be implemented in different ways including as a memory controller, a network controller (NPU) and an ASIC. Each master device 16a and 16b contains at least one DRAC, although only a single DRAC per master device 16a and 16b is shown for purposes of clarity. Upper interconnection arrays 62a and 62b on memory module 50 extend the control lines from the DRCG circuits 14a and 14b and the master devices 16a and 16b to provide for the interconnection of additional memory modules or for bus terminations, neither of which is shown. Maintaining uniform footprints for the interconnection between memory modules as well as to system board 12 reduces the proliferation of different memory module 50 part numbers, and minimizes reliability and qualification testing.

Components in the first channel 50a (not shown) are DRCG circuit 14a, master device 16a, interconnection array 66a, lower interconnection array 64a, substrate 52, memory devices 54a and upper interconnection array 62a. Components in the second channel 50b are DRCG circuit 14b, master device 16b, interconnection array 66b, lower interconnection array 64b, substrate 52, memory devices 54b and upper interconnection array 62b.

The positioning of memory devices 54a and 54b on memory module 50 relative to DRCG circuits 14a and 14b and master devices 16a and 16b provides several improvements compared to the prior art of FIGS. 1a–1c. This is taught in one of the referenced copending U.S. patent applications. The improvements include: reduced propagation delays and hence potentially higher operating frequencies; reduced settling times and periods for the ringing cycle established and associated with impedance mismatches between the bus and termination in a given net, which can also reduce inter-symbol interference (ISI); potentially less intra-bus skew variation, which leads to better timing margins; and simplified and reduced system board 12 routing.

Component positioning on memory module 50 provides another benefit over the prior art. Components are positioned on memory module 50 to allow the module 50 to support multiple (two, in this case) channels 50a and 50b (not shown) of memory. Multiple data paths on a memory subsystem are better shown in the embodiment of FIGS. 3a–3c. This capability allows a single memory module 50, with memory devices 54a and 54b on both sides (assuming memory devices 54a and 54b each have a capacity of 256 MB) to support up to 128 MB of memory (64 MB per channel), with a granularity of 32 MB per channel.

Figure 4:
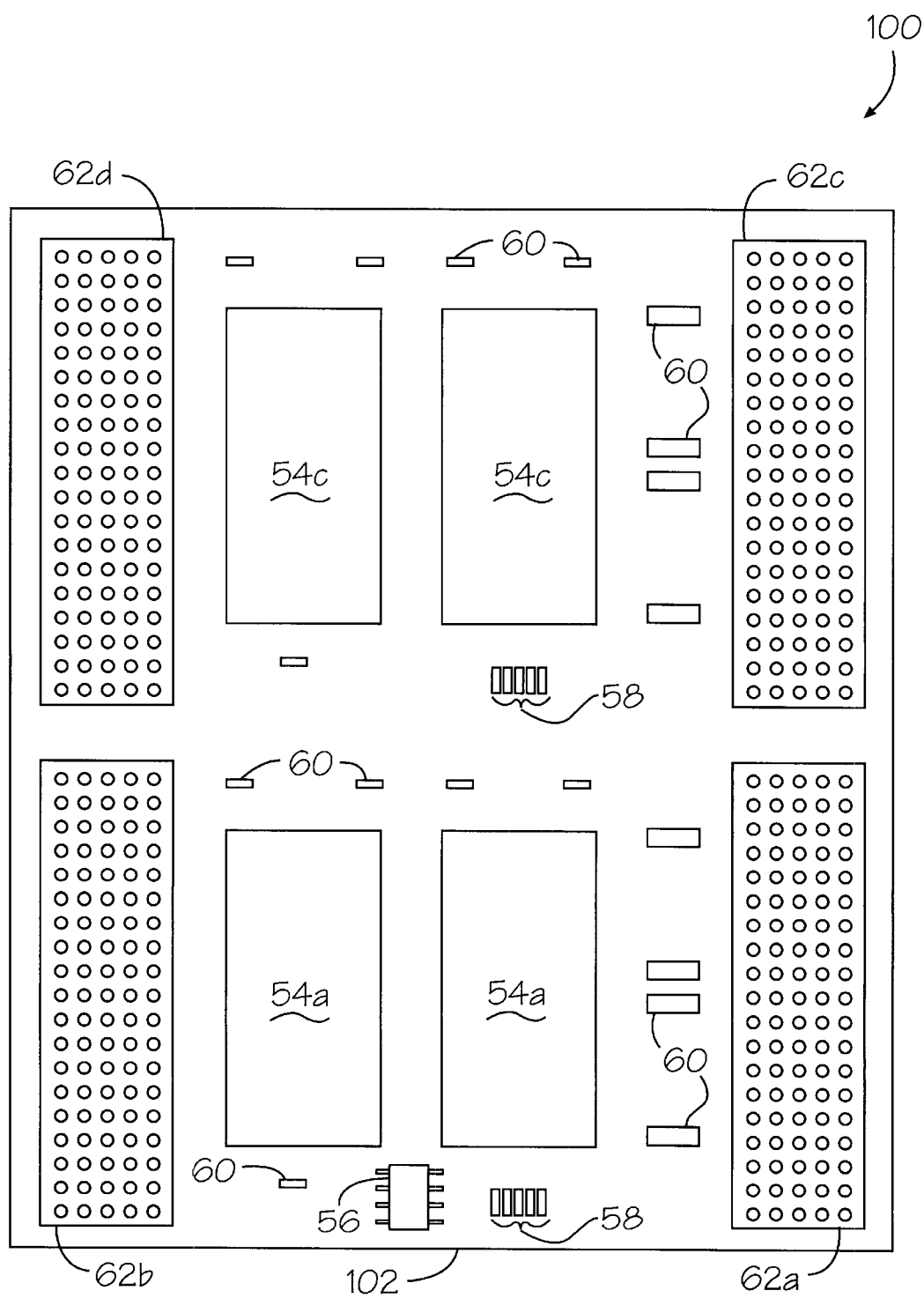

Depending on how interconnection arrays 64a–64b are wired to the system board 12, the memory devices 54a and 54b may be configured to operate in either a single channel or as multiple independent channels. In one example, this option allows the operation of two 16-bit memory channels to act as a 32-bit memory channel, or a single 16-bit memory channel with twice the memory capacity. A 32-bit memory channel has twice the throughput of a 16-bit channel when operated at the same frequency. A higher throughput is important in many industries required to run real-time applications (e.g., gaming, video graphics, speech processing, and networking applications). Increasing throughput through widening the bus is often much easier to implement and less expensive compared to methods such as doubling the clock frequency of the memory subsystem, reducing latency in bus cycles, implementing complex multi-symbol modulation schemes or pulse code modulation (PCM) type approaches. A further extension of this is shown in FIG. 4.

For applications requiring less memory, a single channel 50a or 50b (not shown) of memory can be populated and therefore implemented. For this type of application, since only a single interconnection array pair 62a–64a or 62b–64b is Ineeded but mechanical stability of the overall memory module 50 is desired, to reduce costs the other interconnection array location may be populated by a spacer of similar dimensions as the interconnection array pair. For applications requiring finer granularity, half of the full quantity of memory devices 54a or 54b on a given channel 50a and/or 50b (not shown) can be populated to reduce the granularity to 32 MB.

Figure 2C:
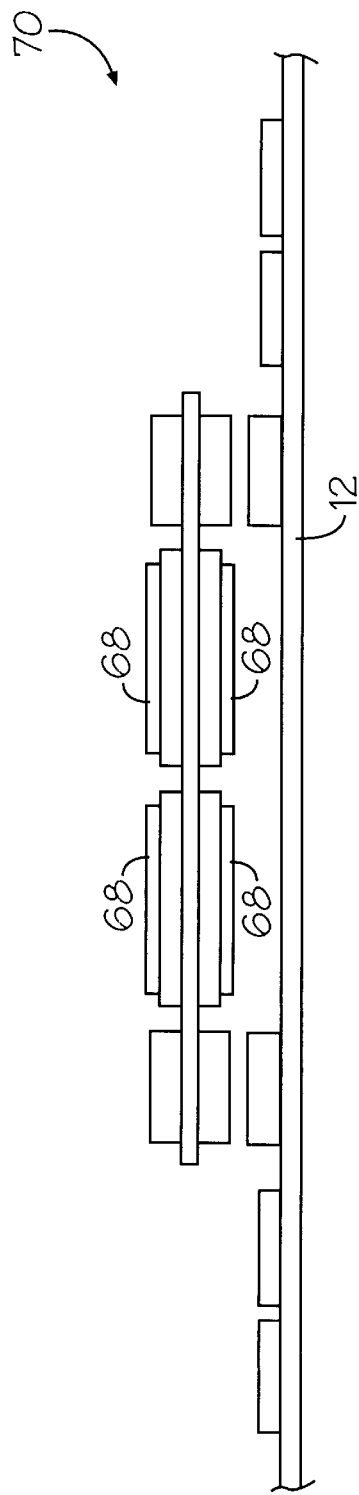
FIG. 2c is a cross-sectional view of the portion of a memory subsystem in accordance with an extension of the embodiment of FIG. 2b.

System electrical performance can be further enhanced by including additional functionality, such as termination components to the module 50, without significantly increasing the cost and size of the module 50. This is taught in one of the referenced copending U.S. patent applications. Also, heatspreaders or equivalent thermal conduction devices 68 may be placed in contact with memory devices 54a and 54b to provide improved thermal management if required. This is shown in FIG. 2c.

Another example of additional functionality is the inclusion of field programmable components (not shown) that may be used to perform functions such as changing the values of the termination components. The field programmable components may include a field programmable gate array (FPGA), whose outputs control solid state switches to switch in resistive, capacitive, or inductive blocks to establish a termination scheme that provides optimized performance. Some connections on the FPGA may be dedicated to a standard PC bus interface such as I2C to make the terminations soft programmable.

Other components that may be added include clock synthesizers, skew control blocks, FIFOs, and thermal shutdown or thermal monitoring integrated circuits that may be installed at strategic hot points on module 50. A thermal shutdown device may be used to disable a power supply until conditions improve. This improves the reliability of memory devices 54a and 54b on module 50.

It should be understood by those skilled in the art that the various components of the invention may consist of alternate materials, instead of or in addition to the particular ones described in the disclosed embodiments, without departing from the spirit of the invention.

Referring now to FIG. 2c, there is shown a cross-sectional view of memory subsystem 70 in accordance with an extension of the embodiment of FIG. 2b, further including thermal management structures 68.

The natural cooling efficiency of a module 50 is low due to the lack of an effective thermal transfer medium from the die or package of memory devices 54a and 54b to the air, and the lack of a short air channel in the direction of air flow (i.e., parallel to system board 12). The thermal problem is exacerbated by the relatively large size of today's memory devices 54a and 54b and the proximity to other heat generating elements in such a dense module 50. The thermal management structures 68 of the inventive modules 50 are designed to optimize both thermal conduction and radiation, thus allowing maximum circuit density without heat build-up, which could degrade memory device 54a and 54b performance and reliability.

Thermal management structures 68 are intended to sink heat away from memory devices 54a and 54b. Such structures 68 may be standalone elements (e.g., heatsinks) or they may provide a low resistance thermal path to another surface such as the outer enclosure of a device (e.g., a laptop computer), which may include thermally conductive material.

Thermal management structures 68 may be implemented in many ways. Structures 68 may be as simple as a layer of thermally conductive material, such as aluminum, attached or retained to memory devices 54a and 54b by thermally enhanced compounds or clamps. Structures 68 may be more complex and include elements such as fins (not shown) to augment cooling. Other methods may include the use of conformal pouches of liquid thermal transfer material, thin heat pipes, and thermoelectric devices. Even other methods of solving thermal issues will be obvious to those skilled in the art.

Figure 3A:
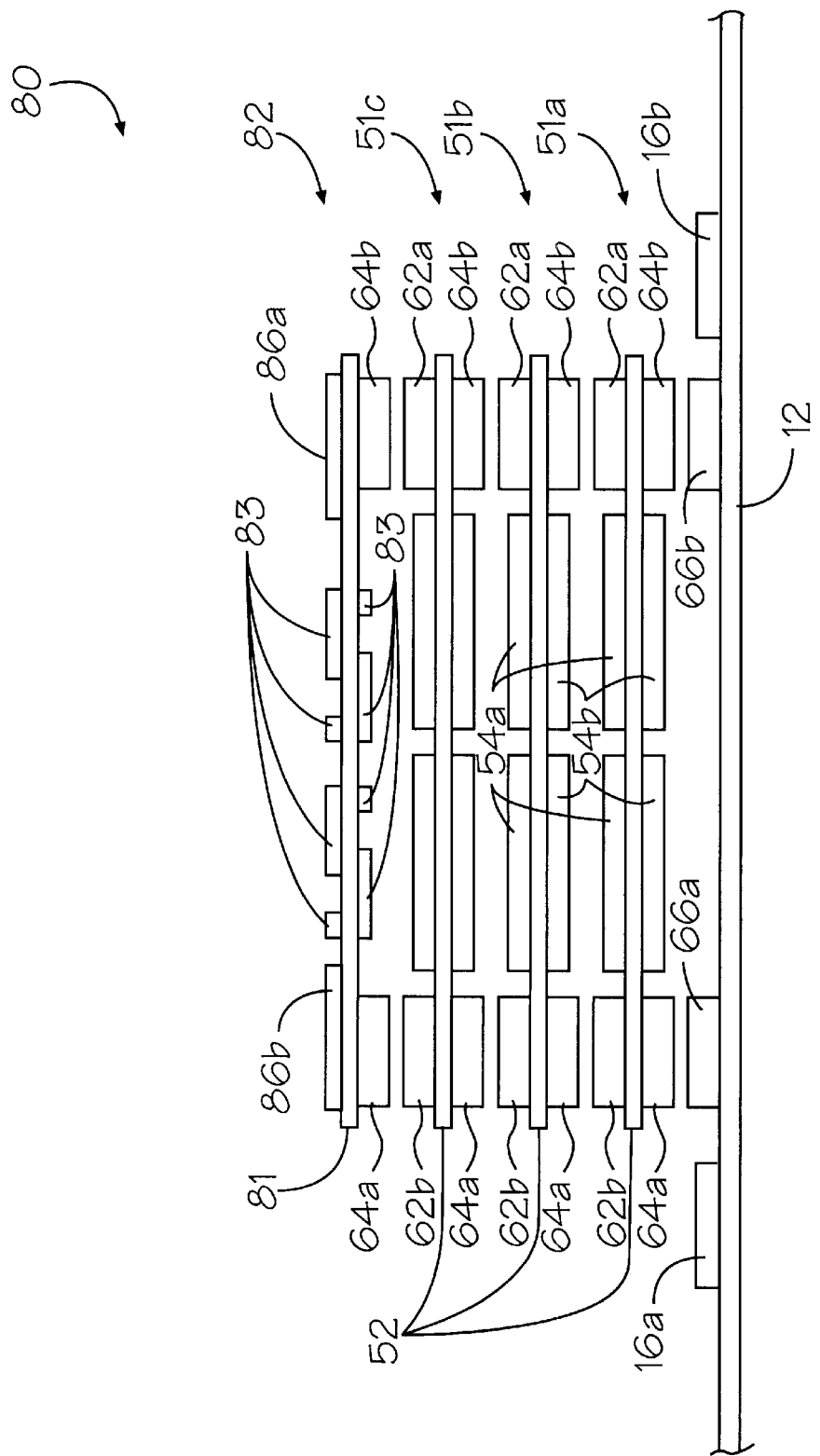
FIG. 3a is a cross-sectional view of a multi-card configuration, including a termination module, in accordance with an extension of the embodiment of FIGS. 2a and 2b.

Referring now to FIG. 3a, there is shown a cross-sectional view of a multi-card configuration 80 based on the memory module 50 of FIG. 2a. In this embodiment, multi-card configuration 80, which includes three memory modules 51a–51c, further includes a termination module 82. Each memory module 51a–51c has a capacity of 128 megabytes of memory in a volume of just 2.0 inches by 1.1 inches by 0.39 inch, or about 0.86 cubic inches, and requires only 2.0 inches by 1.1 inches, or 2.2 square inches of area on system board 12. Compared to prior art embodiments, the area and volumetric requirement of the invention are significantly reduced, especially through the stacking of additional modules 51b and 51c.

Lower interconnection arrays 64a and 64b on the first module 51a are provided to allow electrical interconnection to master devices 16a and 16b, respectively, on system board 12 through mating connectors 66a and 66b. Each master device 16a and 16b contains a DRAC. Upper interconnection arrays 62a and 62b on memory module 51a mate with lower interconnection arrays 64a and 64b on the second module 51b to extend the address and control buses from the master devices 16a and 16b. Upper interconnection arrays 62a and 62b on the second module 51b provide for the stacking of third memory module 51c and termination module 82. Maintaining uniform footprints for the interconnection between memory modules as well as to system board 12 reduces the proliferation of different memory module 50 (FIG. 2a) part numbers, and minimizes reliability and qualification testing. The substrates 52 are designed so that the modules 51a–51c are positionally independent within the stack. In other words, the first module 51a and third module 51c may be interchanged within multi-card configuration 80 and still function properly.

Termination module 82 comprises a substrate 81 and a plurality of components 83, which typically requires a large number of bulk capacitors, ferrite bead inductors, switching regulators, decoupling capacitors, and termination components. The termination components may be passive components such as resistors and/or capacitors, but they may also include active filter-type components. Termination module 82 also includes DRCG circuits 86a and 86b, including their associated components that had been located on system board 12 in the prior art examples. Locating DRCG circuits 86a and 86b on termination module 82 is taught in one of the referenced copending U.S. patent applications. When the CTM/CTMN# differential pair of the DRCG circuit is driven from the module, the three input clocks to the DRCG circuit: PCLK/M, SYNCLK/N, and REFCLK all operate at significantly lower frequencies, thereby simplifying the routing of the printed circuit traces for these nets.

The standard RIMM connectors 22, 36 (FIG. 1a) do not include connections for the signals such as the clock inputs and power supply inputs needed to operate the DRCG circuits 86a and 86b. These connections to the DRCG circuit 86a and 86b may be made by using some of the existing unused contacts on interconnection arrays 64a–64b on termination module 82. Alternatively, it may be desirable to bring these signals in separately by placing one or more additional interface connectors (not shown) on module 82.

Figure 3B:
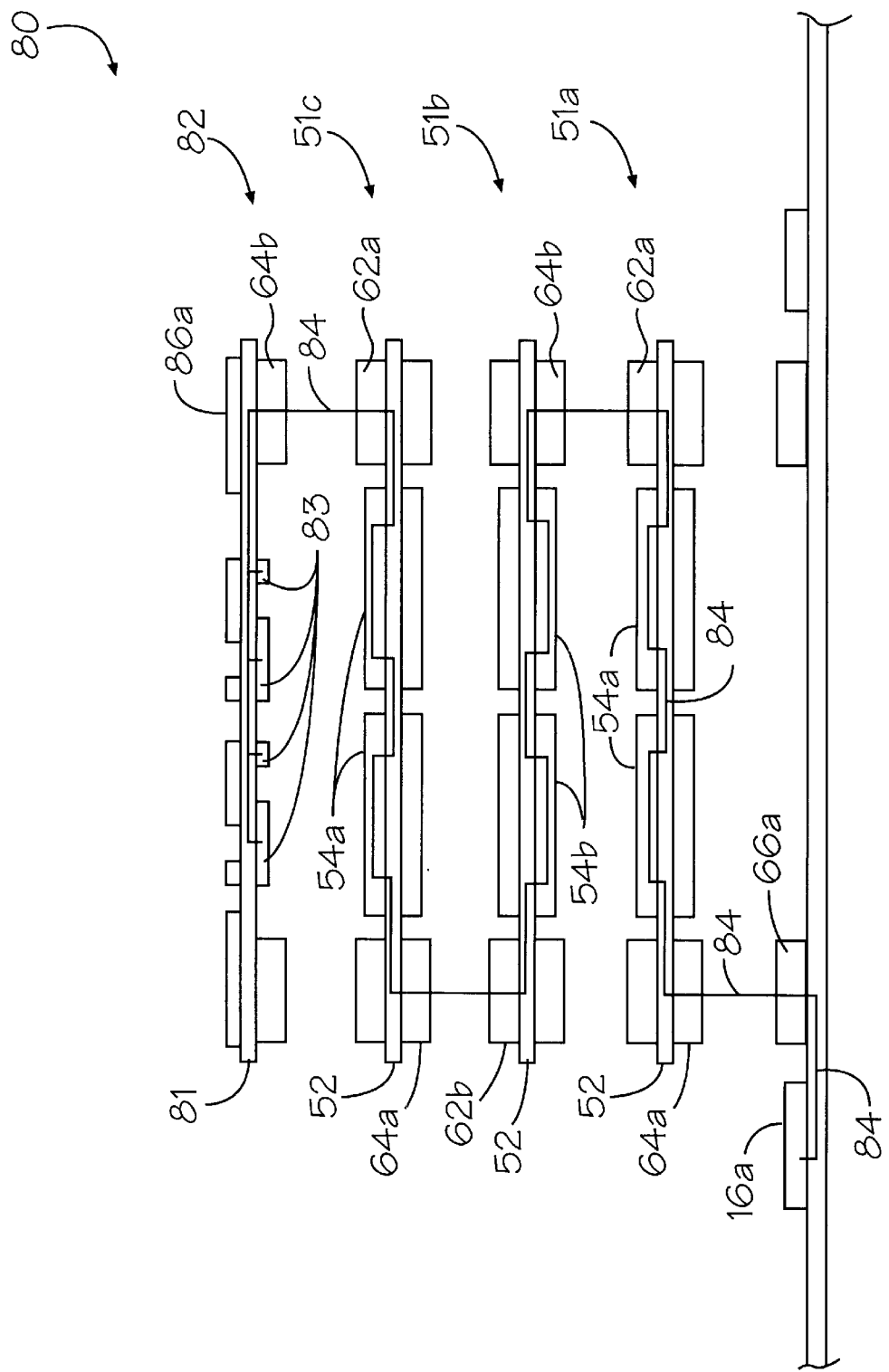

Referring now to FIG. 3b, there is shown a cross-sectional view showing a first RAMBUS channel 84 on the multi-card configuration 80 shown in FIG. 3a. First channel 84 begins at master device 16a, passing through system board 12 and interconnection array 66a to memory module 51a through lower interconnection array 64a. Printed wiring traces on substrate 52 of memory module 51a carry the first channel 84 through memory devices 54a and upper interconnection array 62a to memory module 51b via lower interconnection array 64b on module 51b. Printed wiring traces on substrate 52 of memory module 51b carry the first channel 84 through memory devices 54b and upper interconnection array 62b on module 51b to memory module 51c via lower interconnection array 64a on module 51c. Printed wiring traces on substrate 52 of memory module 51c carry the first channel 84 through memory devices 54a and upper interconnection array 62a to components 83 on termination module 82 via lower interconnection array 64b. The wiring path for the on-module DRCG circuit 86a is not shown for purposes of clarity, but is taught in one of the referenced copending U.S. patent applications.

Figure 3C:
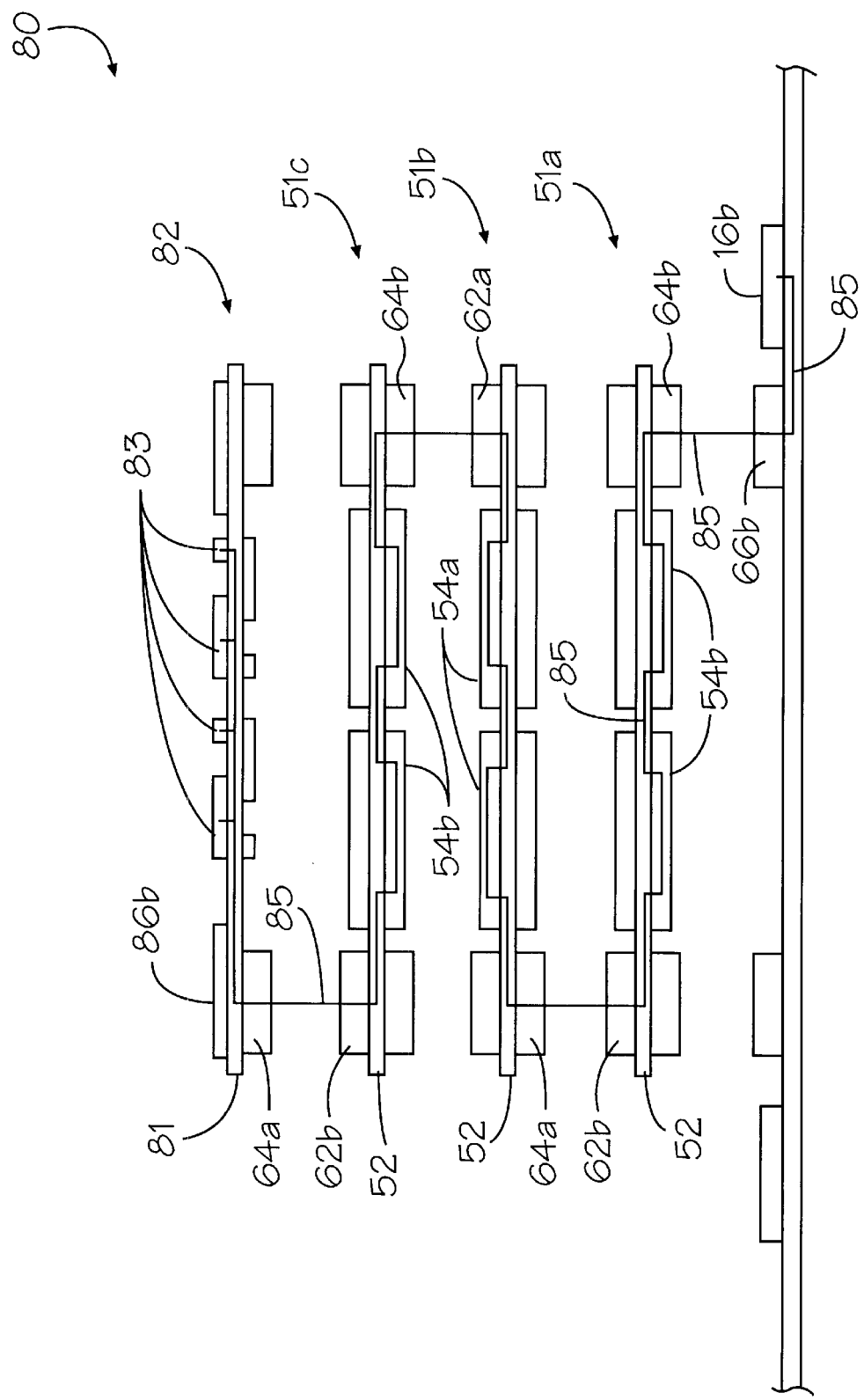

Referring now to FIG. 3c, there is shown a cross-sectional view showing a second RAMBUS channel 85 on the multi-card configuration 80 shown in FIG. 3a. Second channel 85 begins at master device 16b, passing through system board 12 and interconnection array 66b to memory module 51a through lower interconnection array 64b. Printed wiring traces on substrate 52 of memory module 51a carry the second channel 85 through memory devices 54b and upper interconnection array 62b to memory module 51b via lower interconnection array 64a on module 51b. Printed wiring traces on substrate 52 of memory module 51b carry the second channel 85 through memory devices 54a and upper interconnection array 62a on module 51b to memory module 51c via lower interconnection array 64b on module 51c. Printed wiring traces on substrate 52 of memory module 51c carry the second channel 85 through memory devices 54a and upper interconnection array 62a to components 83 on termination module 82 via lower interconnection array 64a. Again, the wiring path for the on-module DRCG circuit 86b is not shown for purposes of clarity.

While the embodiment shown in FIGS. 3a–3c has the advantage of including memory devices 54a and 54b for each channel 84 and 85 on each memory module 51a–51c, which offers multi-card configuration 80 great flexibility, the number of layers of circuitry and the quantity and complexity of vias required for substrate 52 limits the use of this embodiment in cost-sensitive applications.

Figure 3D:
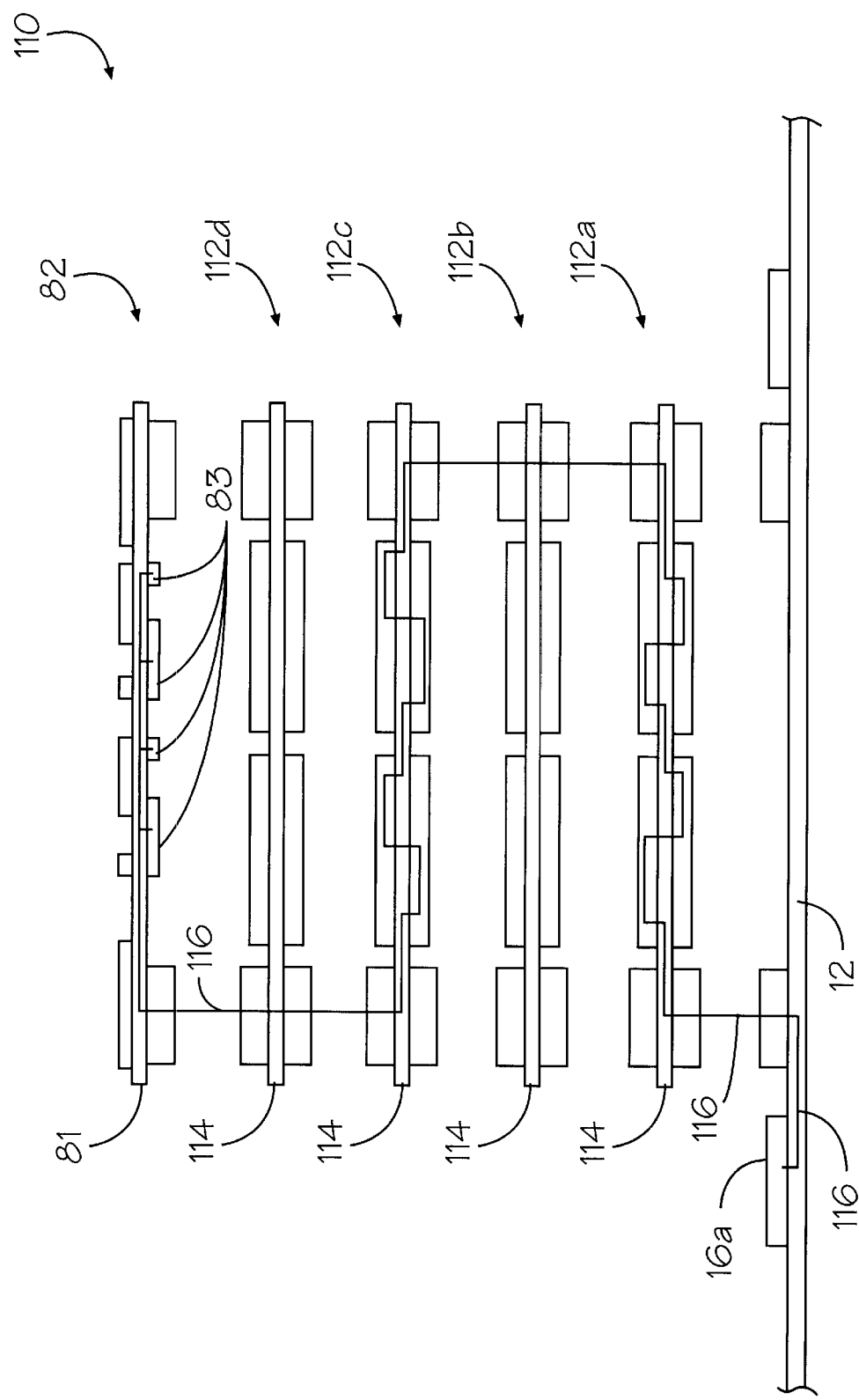
Figure 3E:
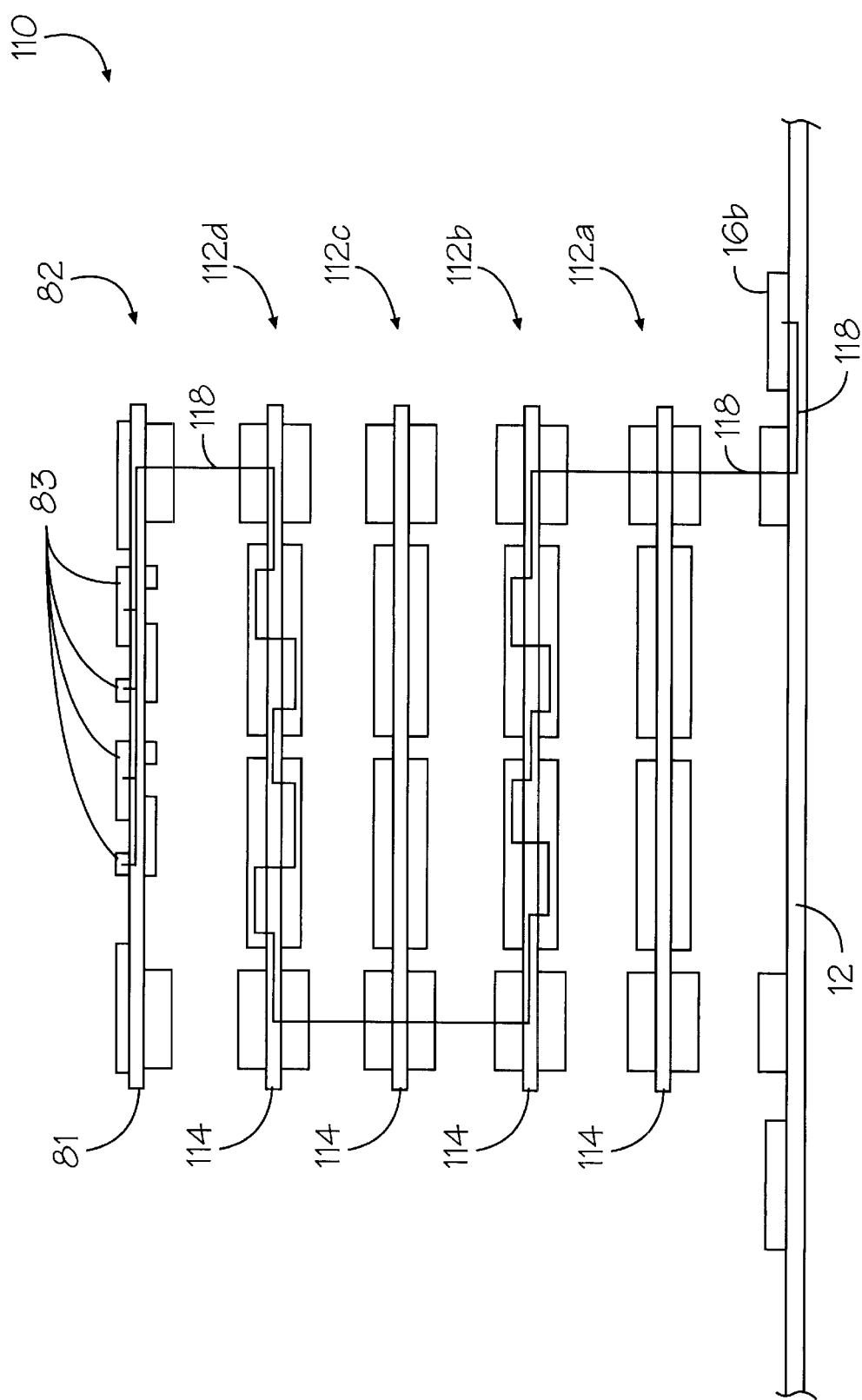

Referring now to FIGS. 3d and 3e, there are shown cross-sectional views of a first and second channel 116 and 118, respectively, of an alternate embodiment based on the multi-card configuration shown in FIG. 3a. In this embodiment, multi-card configuration 110, which includes four memory modules 112a–112d, again includes a termination module 82. Each memory module 112a–112d has a capacity of 128 megabytes of memory in a volume of just 2.0 inches by 1.1 inches by 0.39 inch, or about 0.86 cubic inches, and requires only 2.0 inches by 1.1 inches, or 2.2 square inches of area on system board 12. Compared to the embodiment shown in FIGS. 3a–3c, the substrates 114 of memory modules 112a–112d are significantly less complex and therefore less expensive, thus allowing memory configuration 110 to be used even for cost-sensitive applications. A limitation of this configuration 110 compared to the embodiment shown in FIGS. 3a–3c is that the number of memory modules 112a–112d used must be increased or decreased in pairs to maintain an equal amount of memory on each channel. Multi-channel termination module 82 may also be implemented as two separate termination modules (not shown).

Figure 3F:
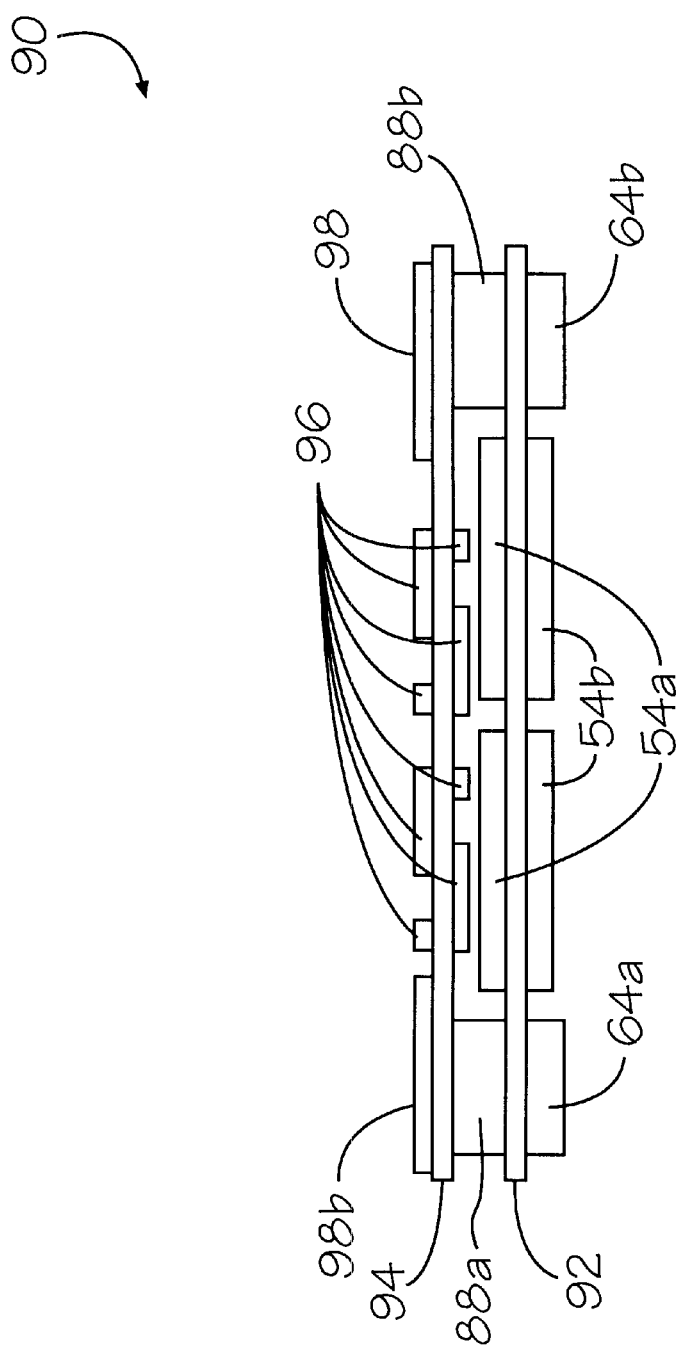

Referring now to FIG. 3f, there is shown a cross-sectional view of a memory module 90 including additional functionality in accordance with an extension of the embodiment of FIG. 3a. In this embodiment, memory module 90 comprises the majority of the electronic components of memory module 51c (FIG. 3a) and termination module 82 (FIG. 3a), and therefore has the same functionality as the two modules 51c and 82 it replaces. Module 90 includes first substrate 92; a plurality of memory devices 54a and 54b; a configuration memory device, resistors, and capacitors (not shown); lower interconnection arrays 64a and 64b; a second substrate 94; termination components 96; DRCG circuits 98a and 98b; and interconnection arrays 88a and 88b. Since substrates 92 and 94 are not required to be field separable, interconnection arrays 88a and 88b are preferably implemented as arrays of BGA or column grid array (CGA) solder connections. It should be understood that for certain applications not all of the inventive features may be required, whereas in other applications additional new features may also be required on module 90. The incorporation of additional functions and features is discussed hereinabove, as well as in one of the referenced copending U.S. patent applications.

Referring now to FIG. 4, there is shown a top view of a memory module 100 in accordance with one embodiment of the present invention based on the memory module 50 of FIG. 2a. Memory module 100 includes a substrate 102, a plurality of memory devices 54a and 54c, a configuration memory device 56, resistors 58, capacitors 60, and upper interconnection arrays 62a–62d. Lower interconnection arrays 64a–64d and memory devices 54b and 54d are located on the opposite side (not shown) of substrate 102. In this embodiment, memory devices 54a–54d are again 256 MB RAMBUS memory devices in CSPs, although other packages, such as bare chip, TSOP, BGA, and COB may be used.

Components are positioned on memory module 100 to allow the module 100 to support four channels 100a–100d (not shown) of memory. This capability allows a single memory module 100 with memory devices 54a–54d on both sides (assuming memory devices 54a–54d each have a capacity of 256 MB) to support up to 256 MB of memory (64 MB per channel), with a granularity of 32 MB per channel in a volume of just 2.25 inches by 2.2 inches by 0.39 inch, or about 1.93 cubic inches, and requires only 2.25 inches by 2.2 inches, or 4.95 square inches of area on system board 12 (FIG. 2b). As stated hereinabove, the effective throughput of a memory subsystem with a four channel (64-bit) RAMBUS data bus, implemented by using four RACs and operating at a frequency of 1066 megahertz is 8.4 GB/s, or more than three times the throughput of an equivalent DDR SDRAM based system. It should be understood that the number of memory channels used is limited only by the throughput required and real estate available.

Since other modifications and changes varied to fit particular operating requirements and environments will be apparent to those skilled in the art, this invention is not considered limited to the example chosen for purposes of this disclosure, and covers all changes and modifications which do not constitute departures from the true spirit and scope of this invention.

Having thus described the invention, what is desired to be protected by Letters Patent is presented in the subsequently appended claims.

What is claimed is:

1. A stackable memory module comprising:
   a) a substrate having a first surface, a second surface and a plurality of contact pads disposed on said first surface thereof, said contact pads being adapted to connect to an external memory bus;
   b) first and second electrical connection means spaced apart on one of said surfaces of said substrate and being operatively connected to said plurality of contact pads forming an extension of said external memory bus;
   c) a plurality of RAMBUS-based memory devices mounted on said substrate and being selectively connected to said external memory bus extension; and
   d) a configuration device located on said substrate to store information thereof;
wherein at least one of said RAMBUS-based memory devices is located between said first and said second electrical connection means.

2. The stackable memory module as recited in claim 1, wherein said external memory bus comprises a predetermined characteristic impedance.

3. The stackable memory module as recited in claim 2, further comprising bus termination means for operative connection to said extension of said external memory bus, said bus termination means having an impedance substantially matching said characteristic impedance.

4. The stackable memory module as recited in claim 3, wherein said bus termination means comprises at least one electrical component from the group: resistors, capacitors and inductors.

5. The stackable memory module as recited in claim 4, wherein said resistors comprise discrete resistors.

6. The stackable memory module as recited in claim 4, wherein said resistors comprise a resistor pack.

7. The stackable memory module as recited in claim 1, further comprising a plurality of capacitors located on at least one of said substrate surfaces.

8. The stackable memory module as recited in claim 1, further comprising a plurality of resistors located on at least one of said substrate surfaces.

9. The stackable memory module as recited in claim 1, further comprising at least one electrical component located on one of said substrate surfaces, said component being selected from the group of: clock synthesizer, skew control block, FIFO, thermal shutdown device, and thermal monitoring device.

10. The stackable memory module as recited in claim 1, wherein at least one of said first and second electrical connection means comprise land grid array connectors.

11. The stackable memory module as recited in claim 1, wherein at least one of said first and second electrical connection means comprise pin grid array connectors.

12. The stackable memory module as recited in claim 1, wherein at least one of said first and second electrical connection means comprise ball grid array interconnections.

13. The stackable memory-module as recited in claim 1, wherein at least one of said first and second electrical connection means comprise portions of pin and socket connectors.

14. The stackable memory module as recited in claim 1, wherein said substrate comprises wiring means connecting at least one of said contact pads on said first surface to at least one of said contact pads on said second surface.

15. The stackable memory module as recited in claim 1, wherein said substrate comprises a multi-layer printed circuit card.

16. The stackable memory module as recited in claim 1, wherein said substrate comprises insulative material.

17. The stackable memory module as recited in claim 16, wherein said insulative material is epoxy-glass-based.

18. The stackable memory module as recited in claim 17, wherein said insulative material comprises FR4.

19. The stackable memory module as recited in claim 18, wherein said insulative material comprises polyimide.

20. The stackable memory module as recited in claim 1, wherein at least one of said plurality of RAMBUS-based memory devices comprises at least one from the group of: bare chip, thin small outline package (TSOP), chip scale package (CSP), ball grid array (BGA), and chip on board.

21. The stackable memory module as recited in claim 1, further comprising a thermal management structure.

22. The stackable memory module as recited in claim 21, wherein said thermal management structure comprises heat-conductive fins in thermal contact with at least one of said plurality of RAMBUS-based memory devices.

23. The stackable memory module as recited in claim 22, further comprising third and fourth electrical connection means operatively connected to said plurality of electrical contacts forming an extension of said external memory bus, and oppositely disposed with respect to said first and second electrical connection means; said third and fourth electrical connection means facilitating interconnection to electrical connection means of a second module.

24. The stackable memory module as recited in claim 23, wherein said second module comprises a second stackable memory module.

25. The stackable memory module as recited in claim 23, wherein said second module comprises a termination module.

26. The stackable memory module as recited in claim 1, wherein said external memory bus comprises a plurality of channels.

27. A stackable memory subsystem comprising a plurality of stackable memory modules, each of said stackable memory modules being positionally independent within said stackable memory subsystem, and each of said stackable memory modules comprising:
   a) a substrate having a first surface, a second surface and a plurality of contact pads disposed thereon, said contact pads being adapted to connect to an external memory bus;
   b) first and second electrical connection means spaced apart on each of said surfaces of said substrate and being operatively connected to said plurality of contact pads forming an extension of said external memory bus;
   c) a plurality of RAMBUS-based memory devices mounted on said substrate and being selectively connected to said external memory bus extension; and d) a configuration device located on said substrate to store information thereof.

28. The stackable memory subsystem as recited in claim 27, wherein said external memory bus comprises a predetermined characteristic impedance.

29. The stackable memory subsystem as recited in claim 27, further comprising an additional module.

30. The stackable memory subsystem as recited in claim 29, wherein said additional module is a termination module.

31. The stackable memory subsystem as recited in claim 30, wherein said termination module comprises bus termination means for operative connection to said extension of said external memory bus, said bus termination means having an impedance substantially matching said characteristic impedance.

32. The stackable memory subsystem as recited in claim 31, wherein said bus termination means comprises at least one electrical component from the group: resistors, capacitors and inductors.

33. The stackable memory subsystem as recited in claim 32, wherein said resistors comprise discrete resistors.

34. The stackable memory module as recited in claim 32, wherein said resistors comprise a resistor pack.

35. The stackable memory subsystem as recited in claim 32, wherein said bus termination means comprises a semiconductor device.

36. The stackable memory subsystem as recited in claim 31, wherein said termination module comprises a power supply circuit to provide power to said bus termination means.

37. The stackable memory subsystem as recited in claim 30, wherein said termination module comprises at least one component integral to a memory control subsystem mounted on the substrate of said termination module.

38. The stackable memory subsystem as recited in claim 37, wherein said at least one component integral to a memory control subsystem comprises a clock generator circuit.

39. The stackable memory subsystem as recited in claim 38, wherein said clock generator circuit is a Direct RAMBUS Clock Generator (DRCG) circuit.

40. The stackable memory subsystem as recited in claim 27, wherein said external memory bus comprises a plurality of channels.

41. The stackable memory subsystem as recited in claim 27, wherein said stackable memory modules comprise a plurality of channels.

* * * * *